(12) United States Patent
Brehin et al.

(10) Patent No.: US 10,244,660 B2
(45) Date of Patent: Mar. 26, 2019

(54) MODULAR ELECTRONIC ASSEMBLY RACK AND MODULAR ELECTRONIC ASSEMBLY COMPRISING SUCH A RACK

(71) Applicant: THALES, Courbevoie (FR)

(72) Inventors: Françoise Brehin, Velizy Villacoublay (FR); Patrick Dupeux, Velizy Villacoublay (FR); Serge Bernadac, Velizy Villacoublay (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/171,575

(22) Filed: Jun. 2, 2016

(65) Prior Publication Data
US 2016/0360648 A1 Dec. 8, 2016

(30) Foreign Application Priority Data
Jun. 2, 2015 (FR) ...................... 15 01136

(51) Int. Cl.
| H05K 5/00 | (2006.01) |
| H05K 7/00 | (2006.01) |
| H05K 7/20 | (2006.01) |
| H04Q 1/02 | (2006.01) |
| H05K 7/14 | (2006.01) |

(52) U.S. Cl.
CPC ........... H05K 7/20545 (2013.01); H04Q 1/09 (2013.01); H05K 7/1424 (2013.01)

(58) Field of Classification Search
CPC ....................................... H05K 5/00
USPC ....................................... 361/679.71
See application file for complete search history.

(56) References Cited

U.S. PATENT DOCUMENTS

| 4,672,509 A | 6/1987 | Speraw |
| 5,129,594 A | 7/1992 | Pease |
| 2002/0012237 A1 | 1/2002 | DiMarco |
| 2002/0153811 A1* | 10/2002 | Kluser ............... H05K 7/1425 312/223.1 |
| 2014/0281224 A1* | 9/2014 | Frink ...................... G06F 1/187 711/114 |

OTHER PUBLICATIONS

Search Report in corresponding French Application 15 01136 dated Apr. 20, 2016.

* cited by examiner

*Primary Examiner* — Jerry Wu
(74) *Attorney, Agent, or Firm* — B. Aaron Schulman, Esq.; Stites & Harbison, PLLC

(57) ABSTRACT

The rack (4), which is provided to receive electronic module that can be plugged in, has a modular construction and comprises at least two rack modules (21), each rack module (21) defining a cell (8) for receiving at least one electronic module (6), each rack module (21) having at least a side wall (22), a lower wall (24) and a rear wall (26) defining the cell (8), the lower wall (24) being configured to ensure a distribution of air inside the cell (8), the rear wall (26) being provided with connector openings (32) for fastening rack connectors (20) provided to engage with electronic module connectors (12), the rack modules (21) being positioned side by side and fastened to one another such that the rack (4) is able to be manipulated as a single unit.

12 Claims, 12 Drawing Sheets

MODULAR ELECTRONIC ASSEMBLY RACK AND MODULAR ELECTRONIC ASSEMBLY COMPRISING SUCH A RACK

The present invention relates to the field of modular electronic assemblies comprising a rack and electronic modules plugged into the rack.

An aircraft has onboard computers for performing functions, for example for monitoring flight parameters or controlling actuators. Computers according to the ARINC 600 avionics standard are dedicated to one function and comprise a housing containing one or more electronic boards, these computers being mounted removably in avionics bays via adapter seats.

It is possible to consider replacing the avionics computers of the ARINC 600 type with modular computers. A modular computer comprises a rack and several electronic modules that can be plugged into the rack. A modular computer generally allows a shorter immobilization time and lower operating cost. If an electronic module fails, it is possible to replace the defective electronic module easily by removing it from the rack and plugging another replacement electronic module into its place, without removing the entire computer.

However, the integration of modular computers in avionics system of an aircraft designed receive computers of the ARINC 600 type may prove difficult.

One aim of the invention is to propose a modular electronic assembly rack making it possible to facilitate its integration into an engine, and in particular into an aircraft.

To that end, the invention proposes a rack for receiving electronic modules, the electronic modules being able to be plugged in side-by-side in the rack, sliding in a longitudinal direction, the rack having a modular construction and comprising at least two rack modules, each rack module defining a cell for receiving at least one electronic module, each rack module having at least a side wall, a lower wall and a rear wall defining the cell, the lower wall being configured to ensure a distribution of air inside the cell, the rear wall being provided with connector openings for fastening rack connectors provided to engage with electronic module connectors of an electronic module inserted in the cell, the rack modules being positioned side-by-side.

According to specific embodiments, the rack comprises one or more of the following features, considered alone or according to any technically possible combinations:

the rack comprises at least one air distribution plenum emerging through openings of the lower wall of at least one rack module while extending over the entire length of the lower wall to supply air to the electronic modules over substantially their entire length;

a rack module has a box structure formed at least partially by the lower wall of the rack module and defining an air distribution plenum emerging through openings of the lower wall;

the lower wall of each rack module is provided with guide members suitable for guiding at least one electronic module sliding along the lower wall;

at least one rack module is provided with removable guide members;

the rack comprises a locking pin dedicated to at least one electronic module and/or a locking pin shared by several electronic modules, preferably all of the electronic modules;

a locking pin shared by several electronic modules is fastened to the front end of the lower wall by a fastening rim wound around the locking pin, the fastening rim being provided with locking openings leaving segments of the locking pin visible;

at least one rack module comprises several walls manufactured by cutting and bending a single metal sheet;

a rack module suitable for receiving several narrow electronic modules, the rear wall of which is provided with an appropriate opening for indifferently receiving rack connectors for several narrow electronic modules or a rack connector for a wide electronic module.

The invention also relates to an electronic assembly including a rack as defined above and electronic modules inserted in the cells defined by the rack modules.

The invention and its advantages will be better understood upon reading the following description, provided solely as a non-limiting example and done in reference to the appended drawings, in which.

Figure 1:
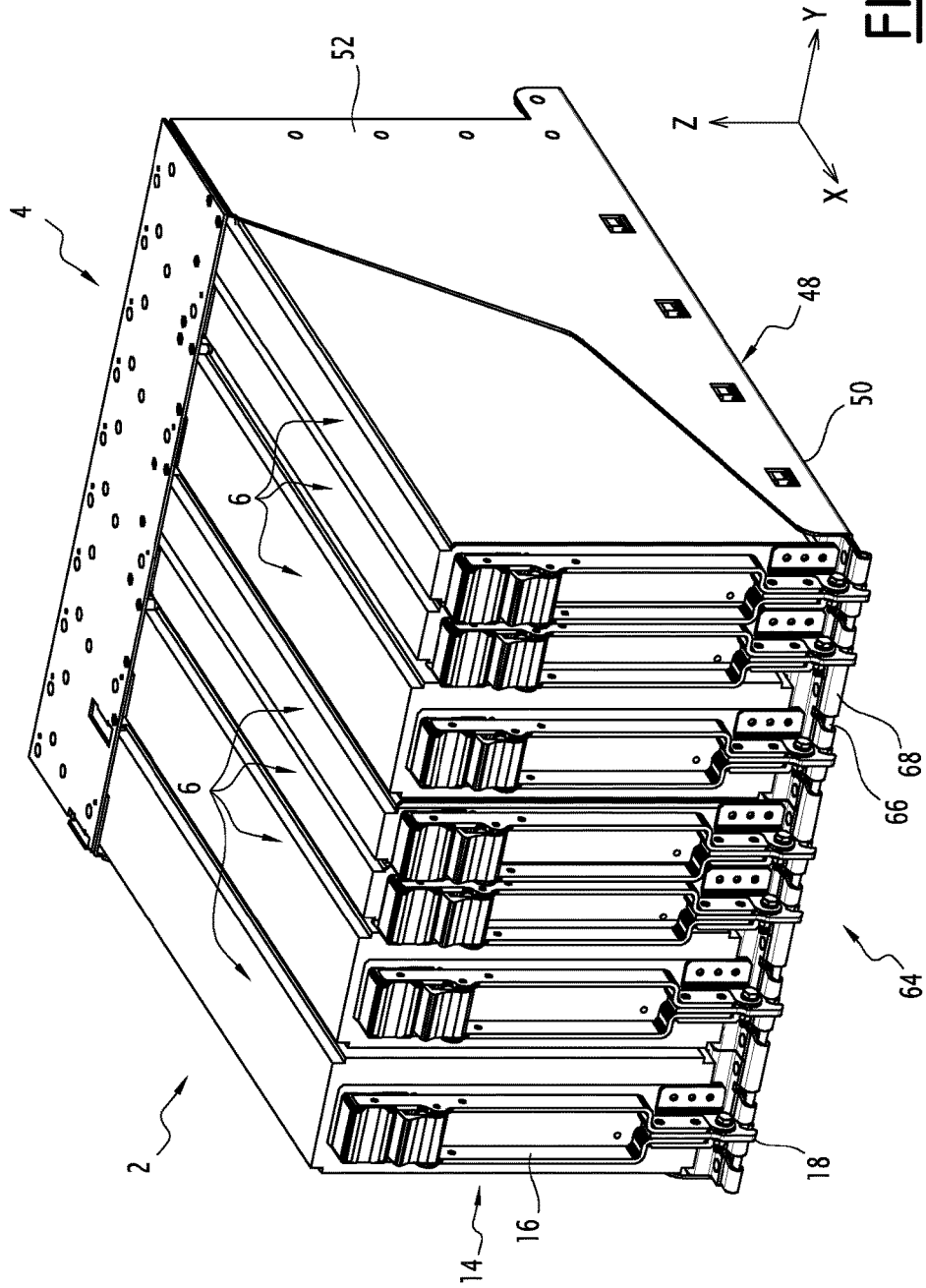
FIG. 1 is a perspective view of a modular electronic assembly comprising a rack and electronic modules plugged into the rack.

The electronic assembly 2 of FIG. 1 is a modular electronic assembly intended to be integrated into an electronics bay of a vehicle, in particular in an avionics bay of an aircraft.

The electronic assembly 2 comprises a rack 4 and several electronic modules 6 able to be plugged into the rack 4 sliding in a longitudinal direction X, from front to back.

The electronic modules 6 are positioned side by side in the rack 4, in a transverse direction Y perpendicular to the longitudinal direction X. Each electronic module 6 can be plugged into the rack 4 by a front face of the rack 4.

In the rest of the description, the terms "longitudinal", "transverse", "front", "rear", "top", "bottom", "upper" and "lower" are defined relative to the longitudinal direction X oriented from back to front, the transverse direction Y oriented from right to left, and a vertical direction Z perpendicular to the longitudinal direction X and the transverse direction Y, and oriented from bottom to top.

Figure 2:
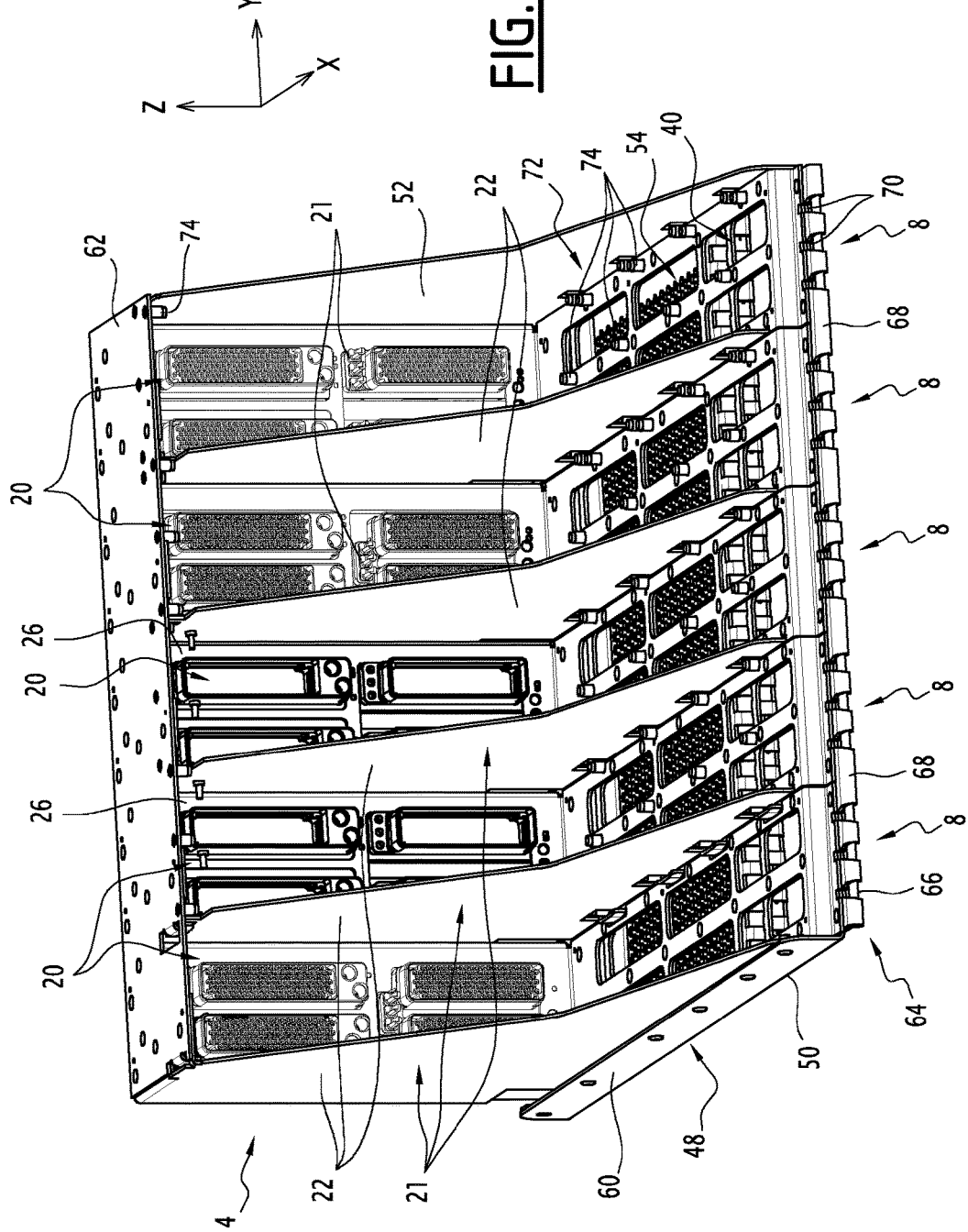
FIG. 2 is a perspective view of the rack alone.

As illustrated in FIG. 2, the rack 4 comprises several cells 8 positioned side by side along the transverse direction Y, each cell 8 being provided to receive at least one electronic module 6 sliding along the longitudinal direction X.

Figure 3:
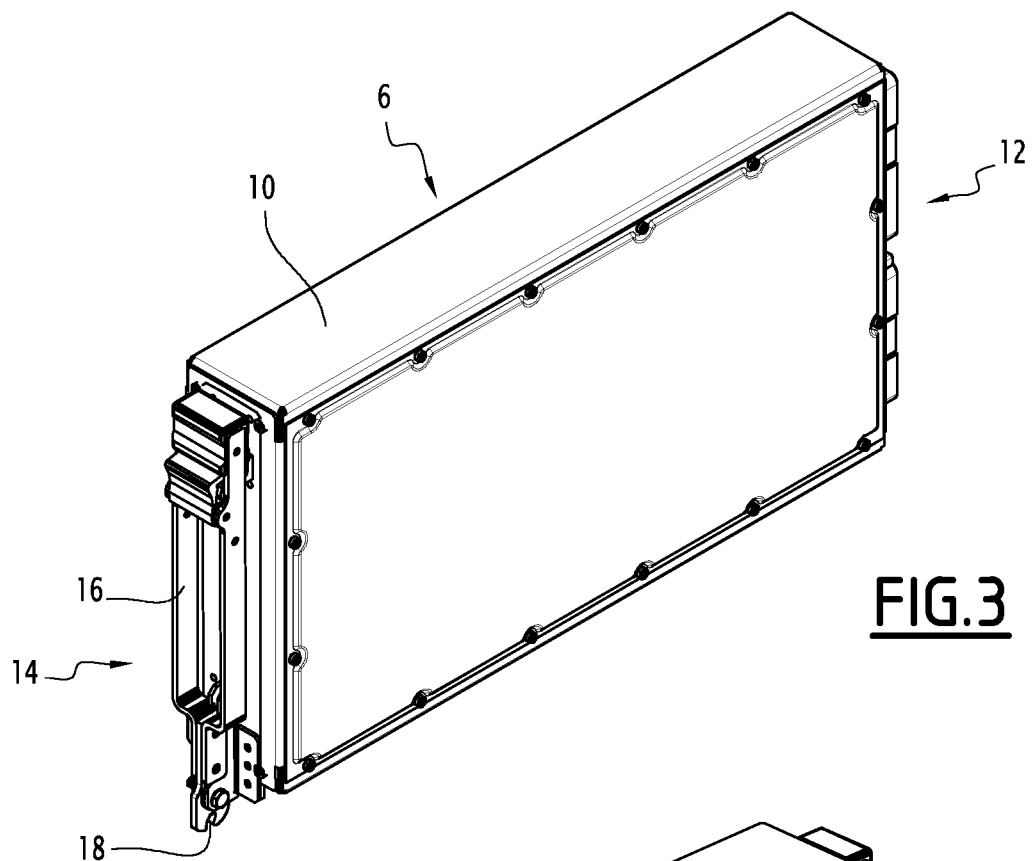
FIGS. 3 and 4 are perspective views of an electronic module of the electronic assembly.
Figure 4:
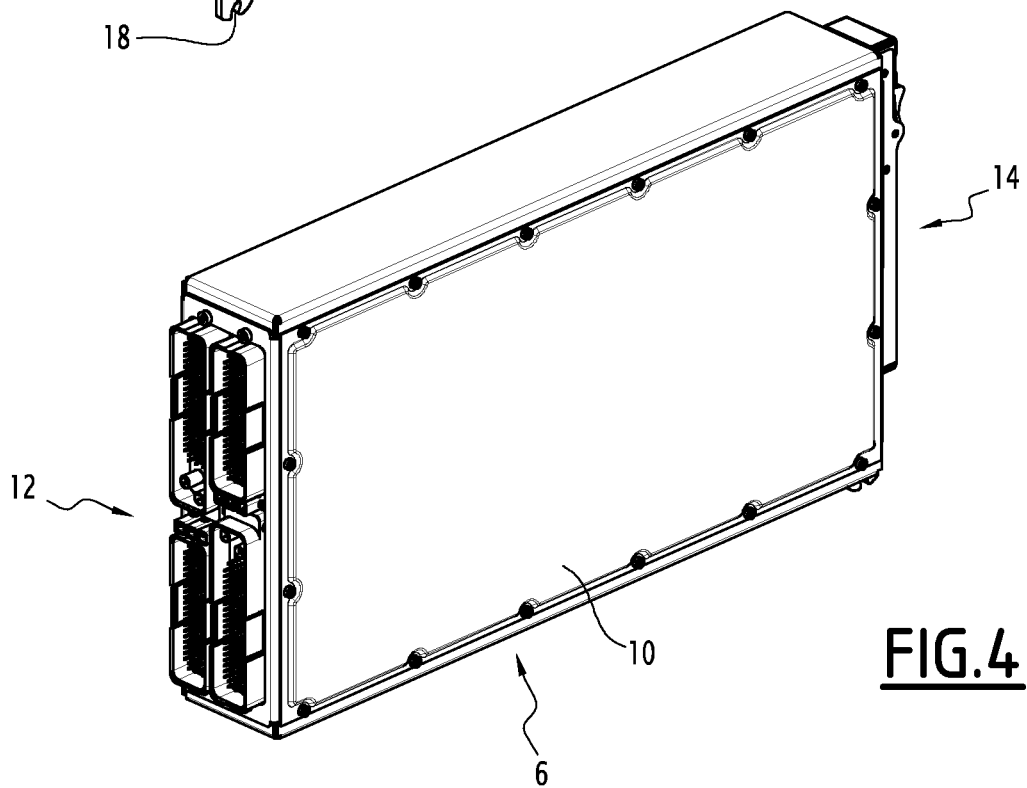

As illustrated in FIGS. 3 and 4, each electronic module 6 has a parallelepiped housing 10 provided, on the rear face (FIG. 4), with one or several electronic module connectors 12 to electrically connect the electronic module 6, and, on a front face (FIG. 3), with a locking device 14 to mechanically lock the electronic module 6 on the rack 4. The locking device 14 here comprises a lever 16 articulated on the housing 10 and provided at its lower end with a notch 18.

The electronic modules 6 have a width that is an integer multiple of a unit of width. The electronic modules 8 for example have a single width (one unit of width), a double width (two units of width) or a triple width (three units of width). The electronic assembly 2 of FIG. 1 has electronic modules 6 with a single width and with a double width.

Each cell 8 is provided to receive one or more electronic modules 6. Each cell 8 is for example provided to receive one, two or three electronic modules side by side.

Each cell 8 further has a width that is an integer multiple of the unit of width, for example a width of one, two or three units of width.

As illustrated in FIGS. 1 and 2, the cells 8 all have the same width, i.e., a double width, and each cell 8 receives an electronic module 6 with a double width or two electronic modules 6 with a single width.

Returning to FIG. 2, the rack 4 is provided, at the rear wall of each cell 8, with one or more rack connectors 20 for the electrical connection of an electronic module 6 received in the cell 8. Each rack connector 20 is complementary with an electronic module connector 12 for their mutual connection due to the insertion of the electronic module 6 in the cell 8 along the longitudinal direction X.

The rack 4 has a modular construction.

The rack 4 comprises several metal rack modules 21 connected to one another, each rack module 21 defining a respective cell 8. The rack modules 21 are similar, and preferably identical.

Figure 5:
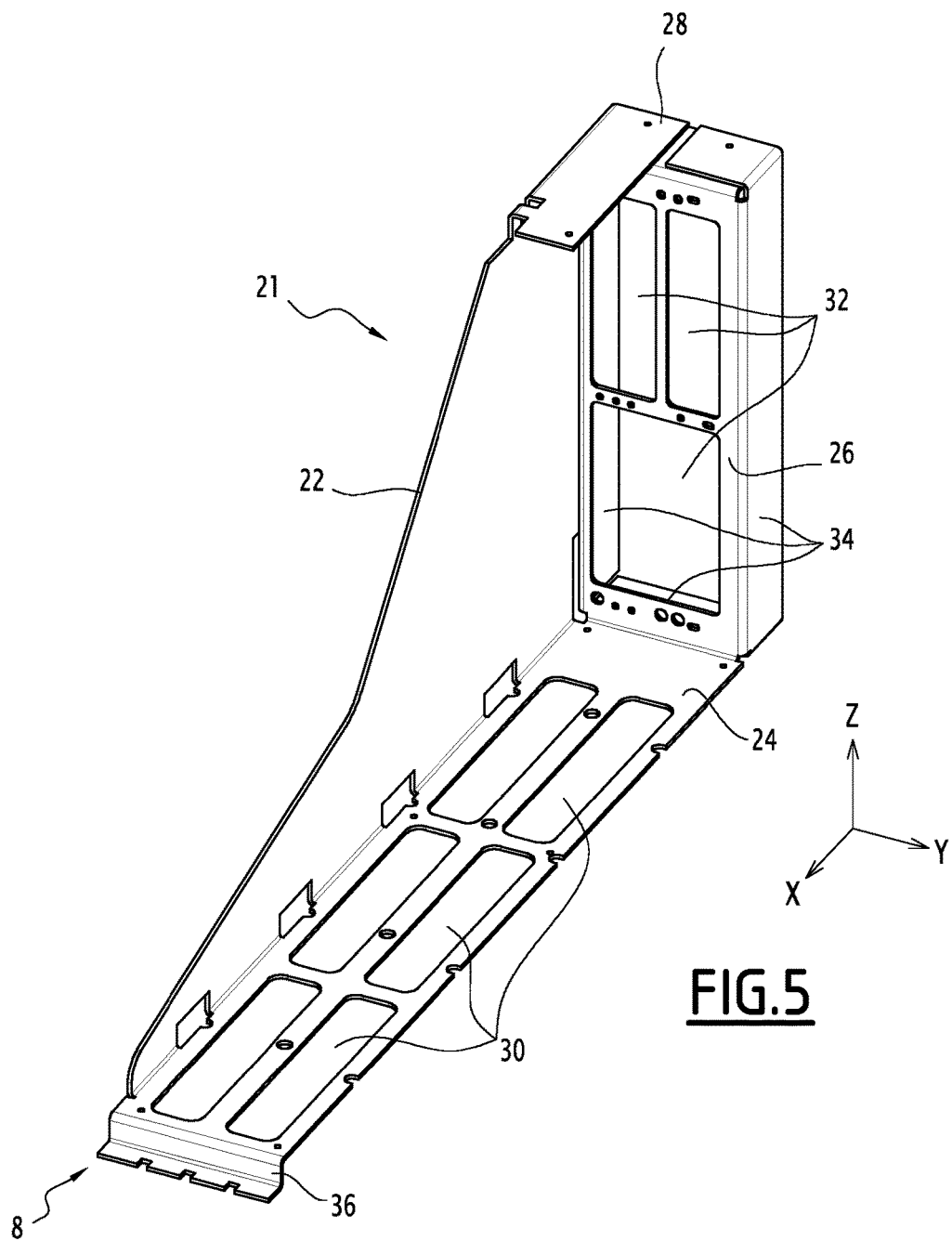
FIG. 5 is a perspective view of a rack module of the rack, provided to be assembled with other modules to form the rack.

As shown in FIG. 5, a rack module 21 comprises a side wall 22, a lower wall 24, a rear wall 26 and an upper wall 28 defining a cell 8.

The lower wall 24 here is longer than the upper wall 28. The side wall 22 has a lower edge extending over substantially the entire length of the lower wall 24 and an upper edge extending over the length of the upper wall 28. The side wall 22 has a generally triangular or trapezoidal shape.

The lower wall 24 is provided with aeration openings 30 for the passage of a flow of cooling air for each electronic module 6 received in the cell 8. The aeration openings 30 extend substantially to the front end of the lower wall 24, to provide aeration of an electronic module 6 received in the cell 8 over the entire length of the electronic module 6.

The rear wall 26 is provided with connector openings 32 to receive the rack connectors 20 of the bottom of the cell 8.

The connector openings 32 are suitable for indifferently receiving rack connectors 20 for several narrow electronic modules (e.g., two single-width electronic modules) or a rack connector 20 for a wide electronic module (for example, one double-width electronic module).

The rack module 21 comprises rear rims 34 positioned along the edges of the rear wall 28 and extending toward the rear from the edges of the rear wall 28.

The rack module 21 comprises an L-shaped front rim 36 positioned on a front edge of the lower wall 24 and extending the lower wall 24 downward and forward.

The rack module 21 is formed in a single piece of material, preferably by cutting and bending a metal sheet.

Figure 6:
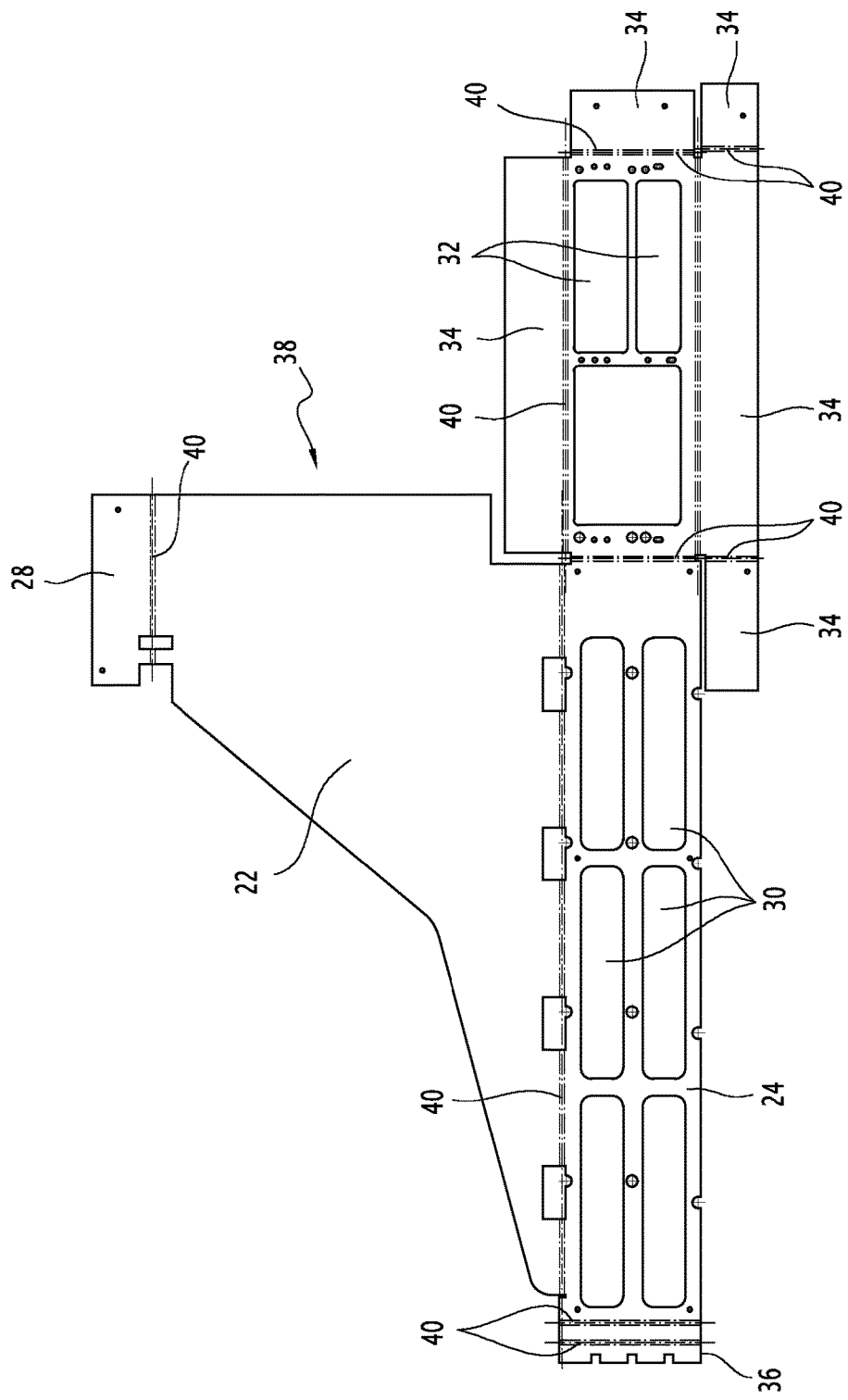
FIG. 6 is a top view of a cut metal sheet provided to be bent to form the rack module.

FIG. 6 illustrates a metal sheet 38 cut out to define the walls, openings and rims of the rack module 21 of FIG. 5, the bending along the bending lines 40 making it possible to bend the metal sheet 38 so as to obtain the rack module 21 of FIG. 5.

Returning to FIG. 2, when the rack modules 21 are positioned side by side, the two cells 8 of each pair of adjacent cells 8 are separated by a side wall 22 of one of the two rack modules 21 defining the two cells 8. Each side wall 22 between two adjacent cells 8 defines a partition separating the two cells 8.

In one alternative, each rack module 21 comprises two side walls 22 defining the cell 8 between them. When the rack modules 21 meet, the two cells 8 of each pair of adjacent cells 8 are separated by a double-walled partition formed by the two adjacent side walls 22 pressed against one another of the two rack modules 21 defining the two cells 8.

The rack connectors 20 are positioned on the rear walls 26 of the rack modules 21, such that the rack connectors 20 engage with the electronic module connectors 12 when they are inserted along the longitudinal direction X in the rack 4.

Figure 7:
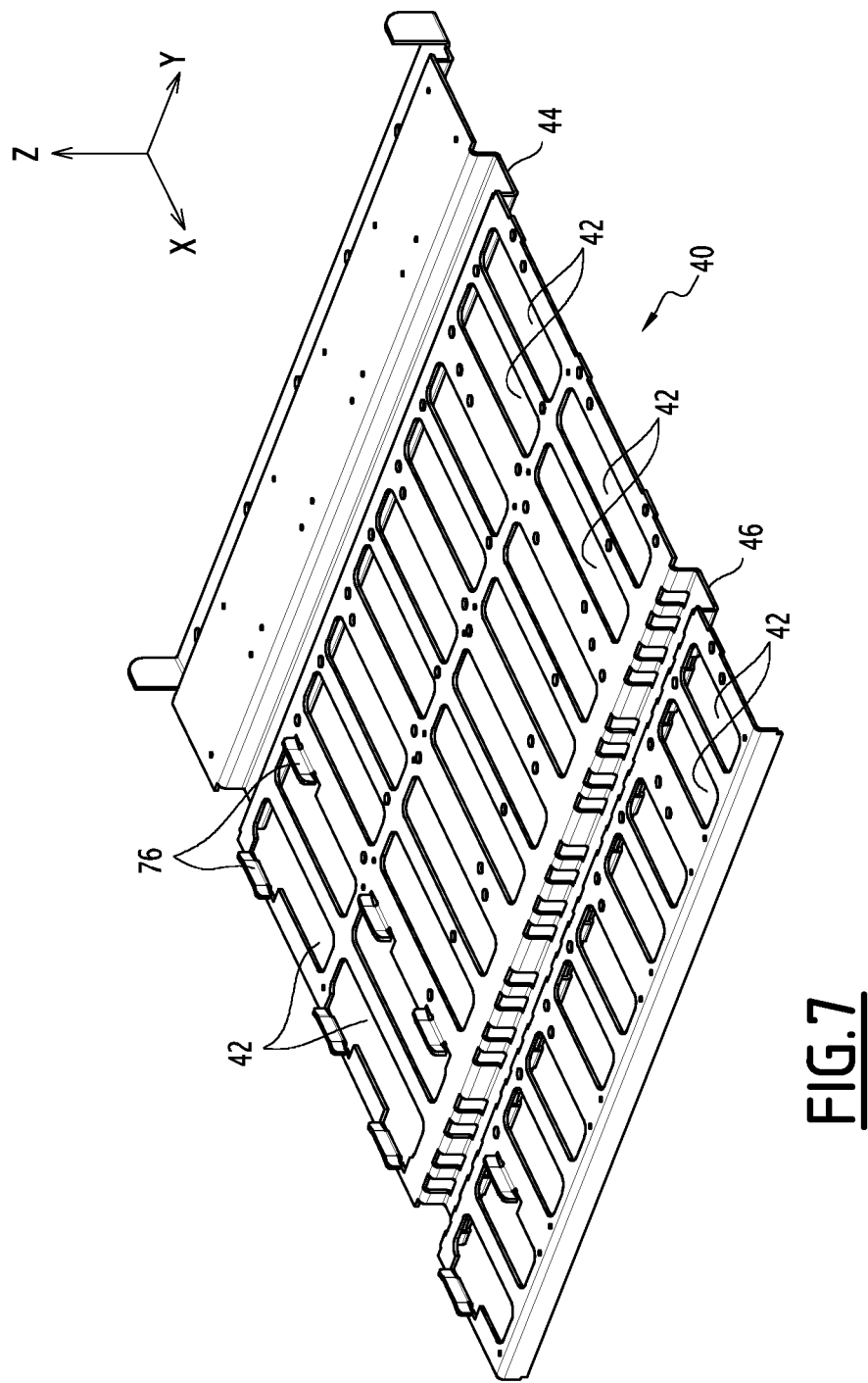
FIG. 7 is a perspective view of a rack module support intended to receive several rack modules side by side.

As shown in FIG. 7, the rack 4 comprises a metal support plate 40 extending over the entire width of the rack 4 and on which the different rack modules 21 are fastened to form the rack 4. The rack modules 21 are placed and fastened side by side on the support plate 40 while applying and fastening the lower walls 24 of the rack modules 21 on the support plate 40.

The support plate 40 lines the lower walls 24 of the rack modules 21. The support plate 40 comprises aeration openings 42 across from the aeration openings 32 of the rack modules 21.

The support plate 40 here comprises two transverse ribs 44, 46 protruding downward and formed by bosses. One of the transverse ribs 44, passing behind the rear walls 26, is solid. The other transverse rib 46, passing below the lower walls 24, is openworked so as not to hinder a distribution of air to the different aeration openings 30.

The support plate 40 is for example formed by cutting and bending a metal sheet.

Figure 8:
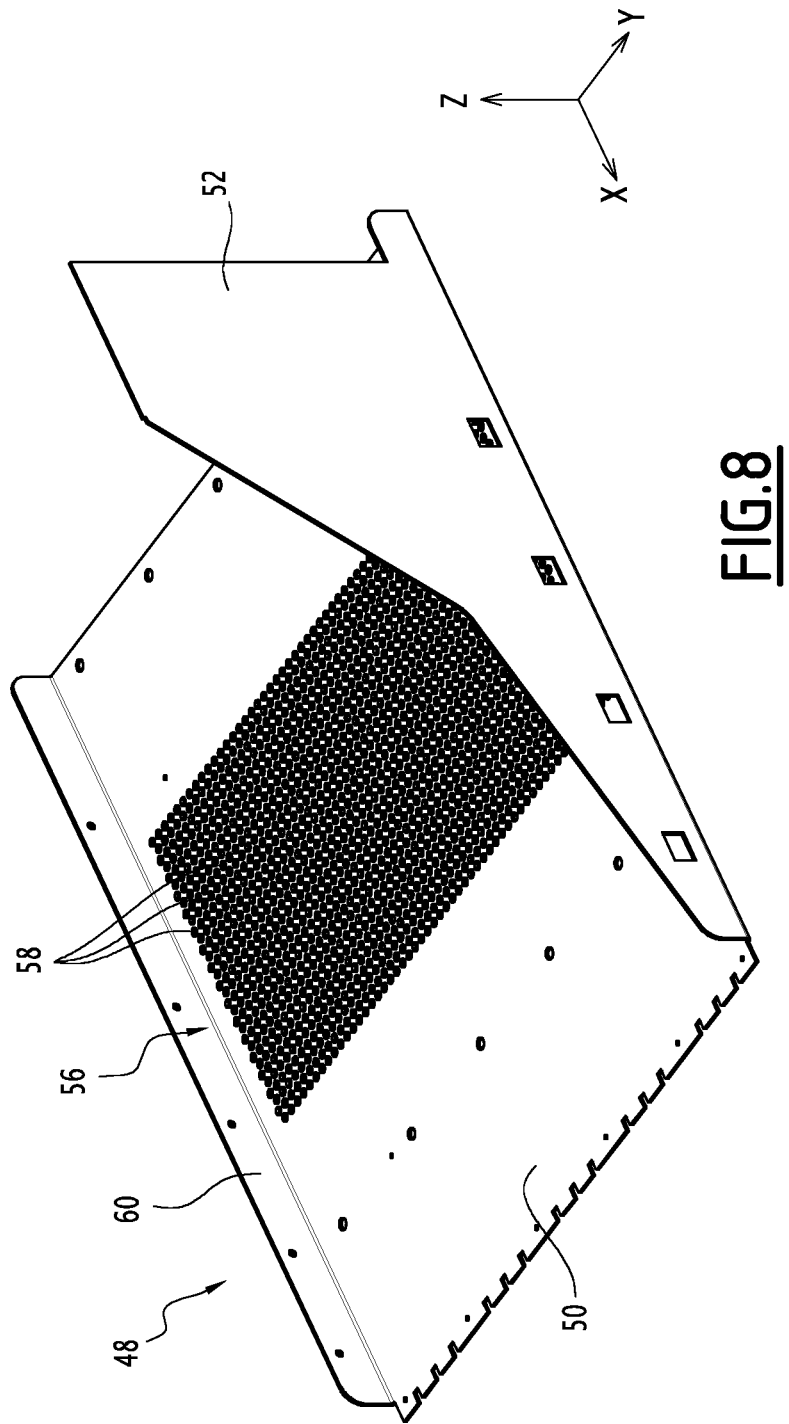
FIG. 8 is a perspective view of a lower reinforcement of the rack.

As illustrated in FIG. 8, the rack 4 comprises a lower reinforcement 48 comprising a lower metal reinforcing plate 50 and a side metal reinforcing plate 52.

The lower plate 50 is provided to be fastened below the support plate 40, while defining, with the support plate 40, a plenum 54 (FIG. 2) for distributing air toward the aeration openings 30 of the lower walls 24 of the rack modules 21. The support plate 40 is provided to bear on top of the lower plate 60 by its transverse ribs 44, 46 so as to define the plenum 54.

The lower plate 50 is provided with an aeration region 56 having aeration orifices 58 for supplying air to the plenum 54. The aeration region 56 has an expanse in the longitudinal direction X that is smaller than that of the aeration openings 30 of the lower walls 24, but the plenum 54 is configured to ensure the distribution of air entering through the aeration orifices 58 over the entire surface area of the aeration openings 30, to allow aeration of the electronic modules 6 over their entire length, in particular toward their front end, where hot electronic components dissipating heat during operation may be situated.

The side plate 52 extends upward from a side edge of the lower plate 50. As shown in FIG. 2, the side plate 52 is provided to laterally close a cell 8 situated at a transverse end of the rack 4 on the side where the rack module 21 defining that cell 8 has no side wall 22. If the rack module 21 is provided with two side walls, the side plate 52 would make it possible to line the outer side wall, to stiffen the rack 4.

The lower reinforcement 48 has a side rim 60 extending upward from the edge of the lower plate 50 opposite the side plate 52.

The lower reinforcement 48 is advantageously obtained in a single piece of material, by bending a metal sheet. Alternatively, the lower plate 50 and the side plate 52 are separate and assembled one to another, each being formed from a metal sheet.

Alternatively, the lower reinforcement 48 has a second side plate 52 provided to close a cell 8 or line a side wall 22 of the rack module 21.

In one embodiment, the rack 4 comprises two side plates 52, one on each side of the rack 4. In this case, the two side plates 52 are integral with the lower plate 50, the two side plates 52 being separate from the lower plate 50 and assembled therewith, or one side plate 52 is integral with the lower plate 50 and the other side plate 52 is separate from the lower plate 50 and assembled thereto.

Figure 9:
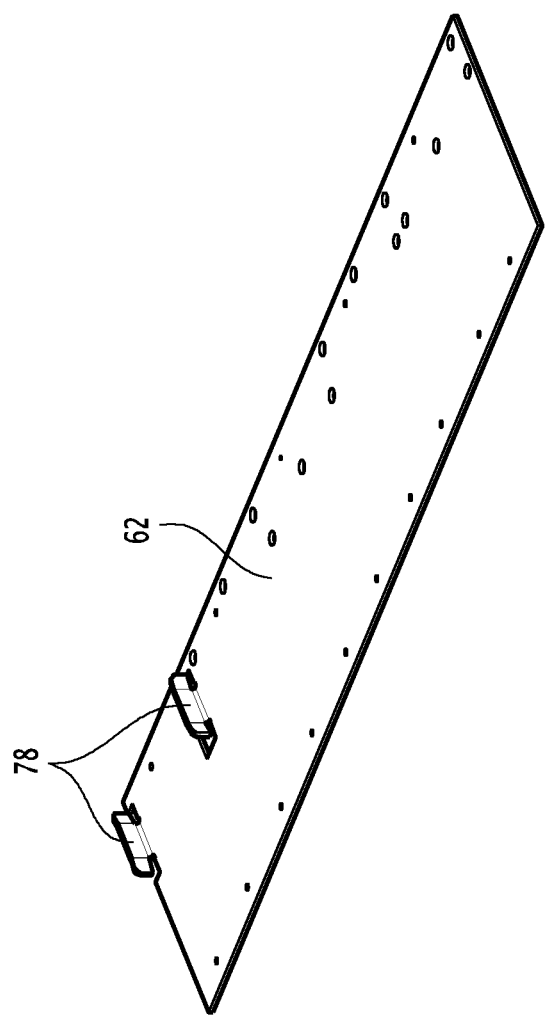
FIG. 9 is a perspective view of an upper reinforcement of the rack.

As illustrated in FIG. 9, the rack comprises an upper reinforcement assuming the form of an upper metal reinforcing plate 62 fastened on top of the rack modules 21 positioned side by side. The upper plate 62 is made from a metal sheet that is cut, and if necessary, bent.

As shown in FIGS. 1 and 2, the rack 4 has a fastening system 64 provided to cooperate with the locking devices 14 of the electronic modules 6 for mechanical locking of the electronic modules 6 in the rack 4.

The fastening system 64 comprises a stationary shared locking pin 66 extending transversely along the rack 4 while passing in front of the various cells 8, so as to be able to engage with the locking devices 14 of the electronic modules 6 plugged into the rack 4. The locking pin 66 is shared by the different cells 8 and the different electronic modules 6 received therein. The locking pin 66 is provided to engage with the notches 18 of the levers 16 of the fastening devices 14.

The fastening system 64 comprises a fastening rim 68 extending along the locking pin 66 and partially wound around the locking pin 66, the fastening rim 68 comprising locking openings 70 leaving segments of the locking pin 66 visible, so as to allow the engagement with levers 16 of the fastening devices 14 with the fastening rod 66, through the locking openings 70.

The fastening system 64 here has three locking openings 70 across from each cell, a central locking opening 70 for locking a double-width electronic module 6, and two locking openings 70 for locking two single-width electronic modules 6.

Figure 10:
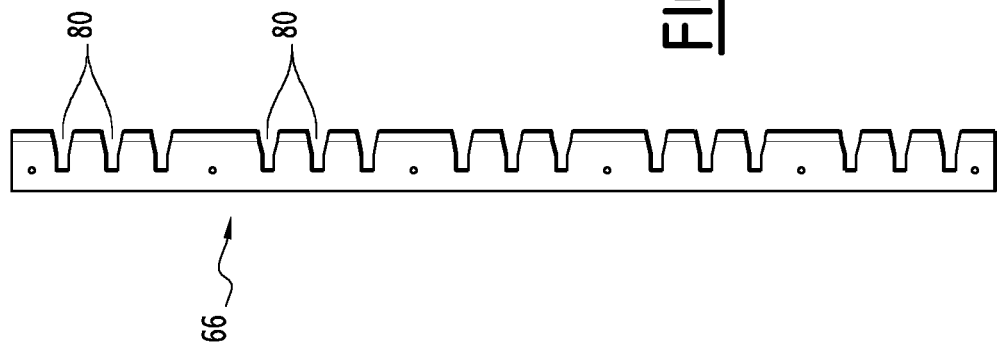
FIG. 10 is a top view of a locking member of the rack, provided to cooperate with locking devices of the electronic modules to lock them in the rack.

As illustrated in FIG. 10 illustrating the fastening rim 68 before winding, the fastening rim 68 comprises a free front edge of the notches 80, such that after winding of the fastening rim 68, the notches 80 define the locking openings 70.

As shown in FIG. 2, the support plate 40 is fastened on the lower plate 50 and the rack modules 21 are fastened on the support plate 40. The fastening rim 68 is fastened to the lower front end of the rack modules 21, on their front rims 36 and/or on the front edge of the lower plate 50.

The rack 4 has guide assemblies 72 for guiding the sliding of the electronic modules 6 in the cells 8. The guide assemblies 72 here comprise removable guide members in the form of slugs 74 fastened on the lower walls 24 and the upper walls 28.

Such guide assemblies 72 are easily adaptable depending on the number of electronic modules 6 intended to be inserted in each cell 8. If a single electronic module 6 must be received in a cell 8, two lateral series of slugs 74 on the two sides of the cell 8 are sufficient. If at least two electronic modules 6 must be inserted into the cell 8, it is possible to add an intermediate series of slugs 74 between the two lateral series of slugs 74.

In one alternative, the rack 4 has no guide assembly, the guiding of the electronic modules 6 being done by the side walls of the cells 8.

Alternatively, as illustrated in FIGS. 7 and 9, a guide assembly for a cell 8 comprises lower tongues 76 cut and bent in the support plate 40 and protruding in the cell 8 through openings of the lower plate 24 of the rack module 21, and upper tongues 78 cut and bent in the upper plate 62.

Such guide assemblies are made easily and at no additional cost during the cutting and bending operations for metal sheets provided to produce the rack modules 21, the support plate 40 and the upper plate 62.

In the rack of FIG. 2, the rack modules 21 are identical. Alternatively, it is possible to provide rack modules 21 having a similar structure, allowing them to come together to form the rack 4, but having differences based on the electronic modules 6 received by each rack module.

Thus, in one alternative, the rack 4 has rack modules 21 having different widths, for example single-width rack modules, double-width rack modules and/or triple-width rack modules.

In one alternative, the rack 4 has rack modules 21 having connector openings with different contours, to receive different rack connectors, based on the electronic module connectors of the electronic modules intended to be plugged into the different rack modules 21.

In one alternative, the rack 4 has rack modules 21 having different specific aeration openings based on the electronic modules 6 intended to be plugged into the different rack modules 21.

Figure 11:
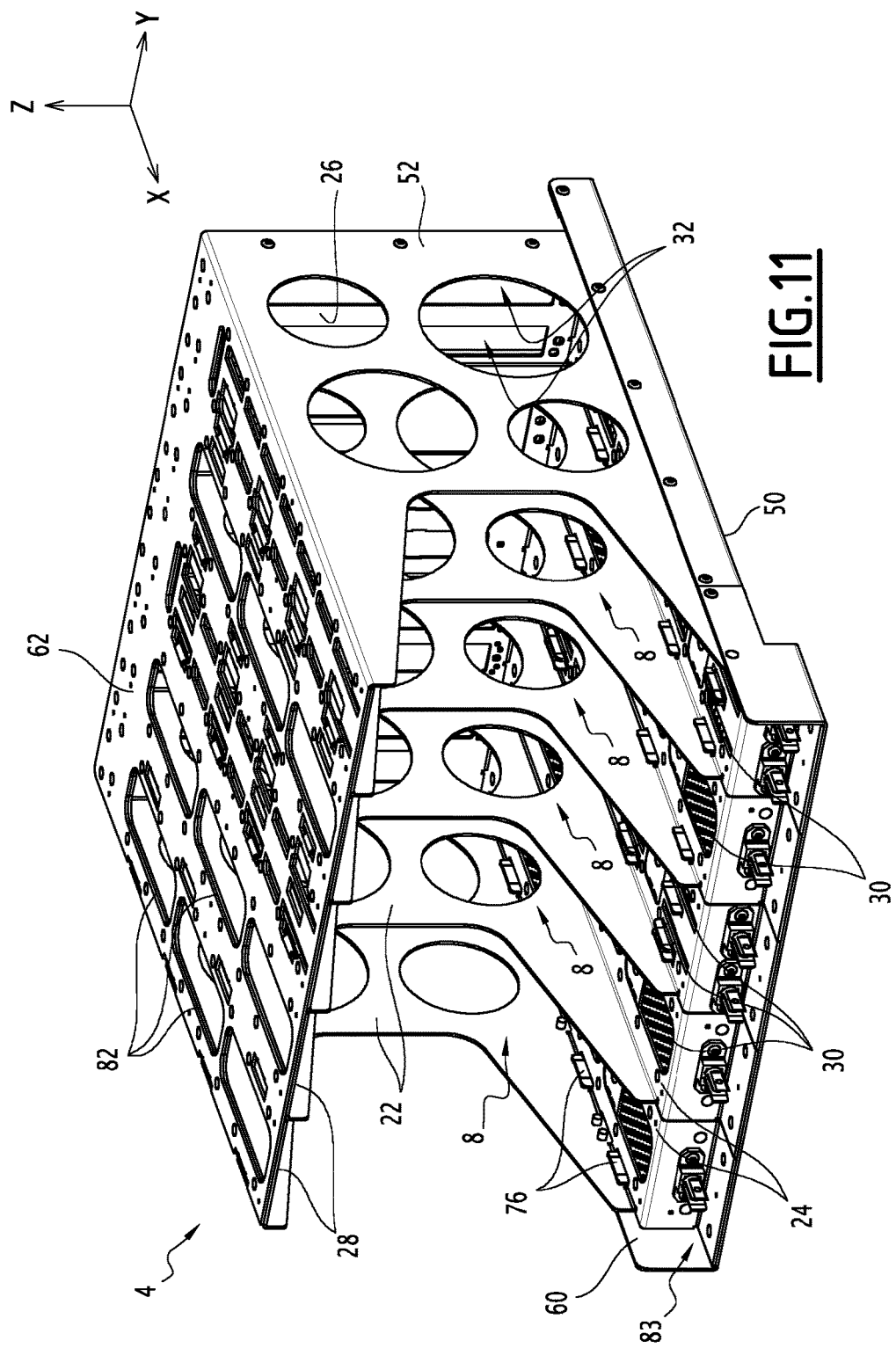
FIGS. 11 and 12 are perspective views of a modular construction rack according to one alternative.
Figure 12:
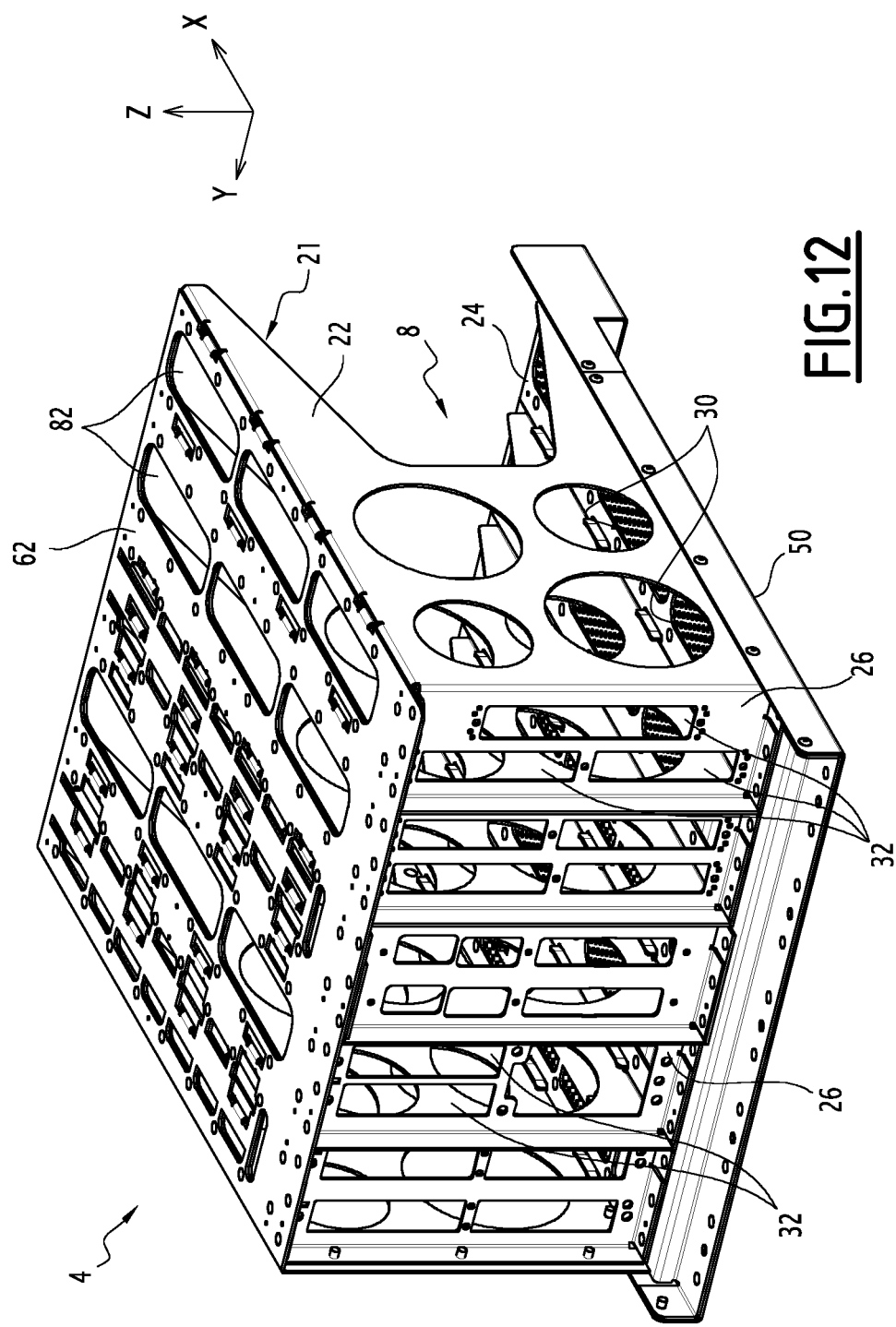
Figure 13:
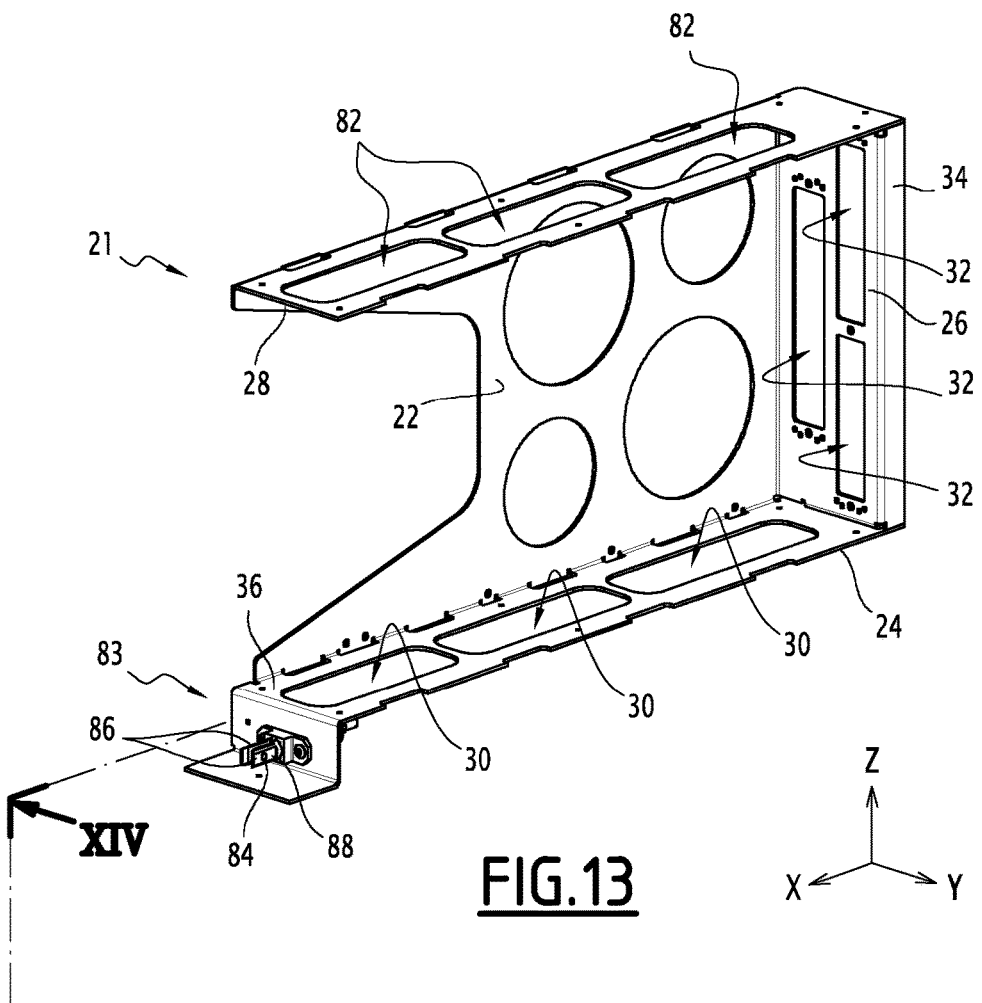
FIG. 13 is a perspective view of a rack module of the rack of FIGS. 11 and 12.

The rack 4 of FIGS. 11 and 12 and its rack modules 21, one of which is visible alone in FIG. 13, differ from those of FIGS. 1 and 2 in that the rack modules 21 have more expansive upper walls 28, practically as long as the lower walls 24. The side walls 22 have a rectangular general shape, with a cutout on the front edge, here a trapezoidal cutout, and solid material cutouts, here circular cutouts, to make the rack 4 lighter.

The upper walls 28 are provided with discharge openings 82 for the passage of hot air having crossed through the electronic modules 6. The upper plate 62 is also more expansive, and has openings across from the discharge openings 82.

Furthermore, the lower walls 24 have different aeration openings 30 from one rack module 21 to another, and different connector openings 32 from one rack module to another 21.

The more expansive side 22 and upper 28 walls make it possible to obtain a more rigid rack.

To form a rack 4 like that of FIGS. 11 and 12, it is possible to position several predefined types of rack modules 21 and to select appropriate rack modules 21 from among the predefined types of rack modules 21 to produce a new rack 4 modularly, which remains more cost-effective than manufacturing a specific rack for each new application.

Furthermore, in FIG. 11, the side plate 52 is separate from the lower plate 50 and fastened thereon. The side plate 52 is, however, integral with the upper plate 62.

Furthermore, the rack 4 of FIGS. 11 and 12 differs from that of FIGS. 1 and 2 by its fastening systems for mechanically locking the electronic modules 6 on the rack 4.

The rack of FIGS. 11 and 12 comprises a respective fastening system 83 for each electronic module 6, the fastening system 83 comprising a locking pin 84 supported between two branches 86 of a yoke 88 fastened to the front end of the lower wall 24 of the cell 8. The locking pin 84 is provided to engage with a notch 18 of a lever 16 by inserting the lower end of the lever 16 between the branches 86 of the yoke 88.

Figure 14:
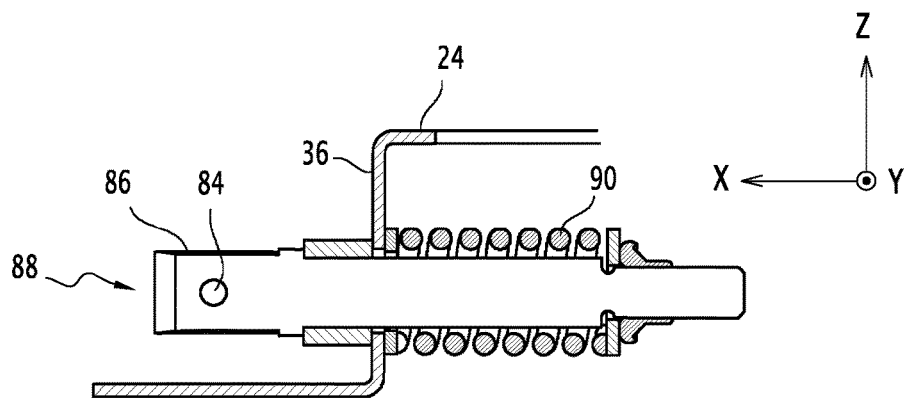
FIG. 14 is a sectional view of a fastening system of the rack of FIGS. 11 and 12, provided to lock an electronic module in the rack.

As illustrated in FIG. 14, the yoke 88 is mounted sliding along the longitudinal direction X on the front rim 36 of a rack module 21 while being biased toward the rear by a spring 90. The yoke 88 slides in the forward direction against the spring 90.

Furthermore, as shown in FIG. 11, the guide assemblies 72 are provided with tongues 76.

The racks 54 of FIGS. 1 and 2 and FIGS. 11 and 12 have a plenum 54 shared by the different rack modules 21 and extending transversely over the entire width of the rack 4. In these particular embodiments, the plenum 54 is defined between a support plate 40 supporting the rack modules 21 and a lower plate 50 fastened below the support plate 40.

Figure 15:
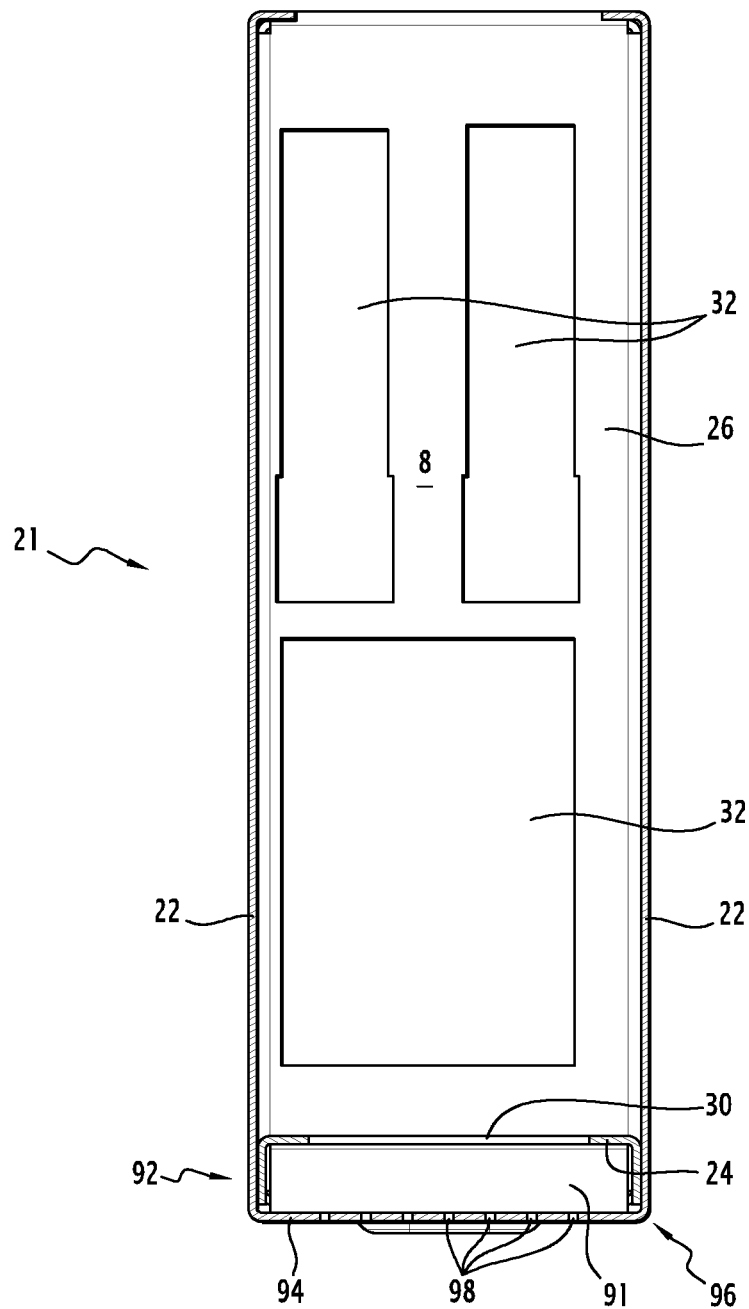
FIG. 15 is a sectional view of a rack module according to one alternative, the rack module having a lower box structure defining a plenum.

In one alternative illustrated in FIG. 15, a rack module 21 defines an individual plenum 91 emerging in the cell 8 defined by the rack module 21 through the openings 32 of the lower wall 24. The rack module 21 comprises, in its lower part, a box structure 92 formed by the lower wall 24 and a bottom wall 94 positioned below the lower wall 24, the plenum 91 being defined in the box structure 92, between the lower wall 24 and the bottom wall 92.

In the illustrated example, the rack module 21 has two side walls 22, and is formed by a part 96 with a U-shaped section whereof the two branches form the side walls 22 of the cell 8 and whereof the bottom connecting the branches defines the bottom wall 94, the lower wall 24 extending transversely between the branches, while being fastened thereto. The bottom wall 94 is provided with air intake orifices 98 for supplying air to the plenum 91 from below the rack 4.

It is possible to assemble several rack modules 21 side by side to form a rack 4, each cell 8 then having its respective plenum 91 defined by the corresponding rack module 21. The rack modules 21 have a box structure with an improved stiffness. It is possible to assemble the rack modules 21 without providing a support plate or lower plate.

In general, the modular construction rack 4 makes it possible to design different racks quickly for modular electronic assemblies 2. This reduces the design and manufacturing costs, and thus makes it possible to obtain racks easily and inexpensively.

The modular construction rack 4, formed by assembling several rack modules 21 each defining a cell for at least one electronic module 6, makes it possible to adapt the rack 4 as a function of the circumstances, and in particular as a function of the electronic modules 6 to be received, in multiple combinations. The rack 4 is made from identical rack modules 21 or from a limited number of different rack modules 21.

The rack modules 21 may in particular differ by their configurations of aeration openings, their configurations of guide elements to be provided for the electronic modules, and/or their configurations of connector receiving openings for connecting the connectors of the electronic modules, on their rear wall.

Once the electronic modules 6 to be used in an onboard electronic assembly are determined, the appropriate rack 4 can be made by assembling rack modules 21. The rack modules 21 are rigidly fastened to one another, such that the rack 4 can be manipulated as a single integral unit.

The rack 4 obtained from rack modules 21 defining cells and each having a side wall 22 making it possible to give the rack 4 a great rigidity, makes it possible, during use, to limit the vibrations experienced by the electronic modules 6.

Furthermore, because of the side walls 22 forming partitions between the cells 8, each cell has substantially the same rigidity, and the electronic modules 6 in the different cells undergo substantially the same vibrations during use.

The modular rack 4 can be obtained with a better compromise between the rigidity, bulk and mass of the rack 4. The ratio between the available surface area for the electronic modules and the total surface area of the rack 4 is optimized.

The rack modules 21 are obtained easily and inexpensively by cutting and bending a metal sheet. The other structural elements of the rack 4 (support plate 40, lower plate 50, side plate 52 and upper plate 62) are also obtained easily and inexpensively by cutting and bending metal sheets.

The structural elements of the rack 4 (rack modules 21, support plate 40, lower plate 50, side plate 52 and upper plate 62) are assembled to one another easily, for example by riveting and/or welding.

The rack 4 is in particular usable to produce an avionics computer. It is generally usable to form an onboard electronic assembly of a vehicle, in particular an onboard computer.

The invention claimed is:

1. A rack for receiving a plurality of electronic modules, said rack comprising separate cells arranged side-by-side in a horizontal transversal direction, each of said electronic modules being configured to be plugged into one of said cells by sliding from front to rear in a horizontal longitudinal direction, each cell being respectively delimited by a lower wall, a rear wall and a side wall, the lower wall being substantially horizontal and configured to ensure a distribution of air inside the cell from openings of the lower wall, the rear wall being substantially vertical and transversal and provided with connector openings for fastening rack connectors provided to engage with electronic module connectors of the electronic module upon insertion into the cell, the adjacent cells being separated by the side wall,
   wherein the rack has a modular construction and is constructed from a plurality of distinct rack modules, each cell being defined in one respective rack module including the lower wall, the rear wall and the side wall delimiting that cell, each of said distinct rack modules being positioned side-by-side in the horizontal transversal direction and fastened to one another by fastening the lower walls on a support plate extending over the entire width of the rack such that the rack is able to be manipulated as a single unit.

2. The rack according to claim 1, comprising at least one plenum emerging through an opening of the lower wall of at least one of said plurality of distinct rack modules.

3. The rack according to claim 1, wherein each of said plurality of rack modules has a box structure formed at least partially by the lower wall of each of said plurality of distinct rack modules.

4. The rack according to claim 1, wherein the lower wall of each distinct rack module is provided with guide members suitable for guiding at least one electronic module to slide along the lower wall.

5. The rack according to claim 4, wherein at least one distinct rack module is provided with removable guide members.

6. The rack according to claim 1, further comprising a locking pin dedicated to at least one electronic module or a locking pin shared by a plurality of the electronic modules.

7. The rack according to claim 6, wherein the locking pin is shared by a plurality of electronic modules, and wherein said locking pin is fastened to the front end of the lower wall by a fastening rim wound around said locking pin, said fastening rim being provided with locking openings leaving segments of the locking pin visible.

8. The rack according to claim 1, wherein at least one distinct rack module comprises several walls manufactured by cutting and bending a single metal sheet.

9. The rack according to claim 1, comprising a rack module suitable for receiving several narrow electronic modules, the rear wall of which is provided with an appropriate opening for indifferently receiving rack connectors for several narrow electronic modules or a rack connector for a wide electronic module.

10. The rack according to claim 1, wherein the electronic modules are plugged in along a longitudinal direction and the distinct rack modules are arranged side-by-side along a transverse direction perpendicular to the longitudinal direction.

11. An electronic assembly comprising the rack according to claim 1 and electronic modules inserted in the cells defined by the distinct rack modules.

12. A rack for receiving a plurality of electronic modules, said rack comprising separate cells arranged side-by-side in a horizontal transversal direction, each of said electronic modules being configured to be plugged into one of said cells by sliding from front to rear in a horizontal longitudinal direction, each cell being respectively delimited by a lower wall, a rear wall and a side wall, the lower wall being substantially horizontal and configured to ensure a distribution of air inside the cell from openings of the lower wall, the rear wall being substantially vertical and transversal and provided with connector openings for fastening rack connectors provided to engage with electronic module connectors of the electronic module upon insertion into the cell, the adjacent cells being separated by the side wall, wherein the rack has a modular construction and is constructed from a plurality of distinct rack modules, each cell being defined in one respective rack module including the lower wall, the rear wall and the side wall delimiting that cell, each of said distinct rack modules being positioned side-by-side in the horizontal transversal direction and fastened to one another such that the rack is able to be manipulated as a single unit; and wherein each rack module has a box structure formed by the lower wall and a bottom wall positioned below the lower wall, said box structure defining in the rack module an individual plenum emerging in the cell defined by the rack module through the openings of the lower wall, each rack having a respective box structure defining a respective plenum.

* * * * *